(12) United States Patent
Leng et al.

(10) Patent No.: US 11,646,278 B2
(45) Date of Patent: May 9, 2023

(54) PACKAGE STRUCTURE AND PACKAGING METHOD

(71) Applicant: Shenzhen Goodix Technology Co., Ltd., Shenzhen (CN)

(72) Inventors: Hanjian Leng, Shenzhen (CN); Baoquan Wu, Shenzhen (CN); Wei Long, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 100 days.

(21) Appl. No.: 17/134,748

(22) Filed: Dec. 28, 2020

(65) Prior Publication Data

US 2021/0118825 A1 Apr. 22, 2021

Related U.S. Application Data

(63) Continuation of application No. PCT/CN2019/089832, filed on Jun. 3, 2019.

(51) Int. Cl.
*H01L 23/60* (2006.01)
*H01L 23/498* (2006.01)
*H01L 21/48* (2006.01)

(52) U.S. Cl.
CPC .......... *H01L 23/60* (2013.01); *H01L 21/4853* (2013.01); *H01L 23/4985* (2013.01); *H01L 23/49838* (2013.01)

(58) Field of Classification Search
CPC .................. H01L 23/60; H01L 23/4985; H01L 23/49838
See application file for complete search history.

(56) References Cited

U.S. PATENT DOCUMENTS 6,469,258 B1   10/2002 Lee et al.
2007/0246806 A1   10/2007 Ong et al.
(Continued)

FOREIGN PATENT DOCUMENTS

CN   101325164 A   12/2008
CN   103531580 A   1/2014
(Continued)

OTHER PUBLICATIONS

Search Report dated Jul. 23, 2021 in corresponding European Application No. 19931580.5; 10 pages.
(Continued)

*Primary Examiner* — Peniel M Gumedzoe
(74) *Attorney, Agent, or Firm* — Maier & Maier, PLLC

(57) ABSTRACT

The present disclosure provides a package structure and a packaging method. The package structure provided by the present disclosure includes: a package base and a redistribution layer disposed on the package base; where the package base includes a plurality of device areas; and a channel set is provided in the device area, where the channel set is used to connect an electronic device, and the redistribution layer is used to lead a subset of to-be-protected channels that needs electrostatic protection in the channel set out to a preset area on the package base, so that all or part of channels in the subset of to-be-protected channels form a series circuit in the preset area, and the series circuit is used to connect with an electrostatic discharge end. The package structure of the present disclosure can provide electrostatic protection for the channel that needs to be protected during a packaging process.

10 Claims, 4 Drawing Sheets

(56) References Cited

U.S. PATENT DOCUMENTS

| | | | |
|---|---|---|---|
| 2008/0305579 A1* | 12/2008 | Lin | H01L 24/80 438/114 |
| 2011/0089540 A1 | 4/2011 | Drost et al. | |
| 2014/0203397 A1* | 7/2014 | Yen | H01L 21/76885 438/381 |
| 2015/0069577 A1 | 3/2015 | Hart et al. | |

FOREIGN PATENT DOCUMENTS

| | | |
|---|---|---|
| CN | 205486157 U | 8/2016 |
| CN | 109449140 A | 3/2019 |

OTHER PUBLICATIONS

Indian Examination Report dated Jan. 20, 2022, corresponding to Indian Application No. 2 02037056378; 5 pages (with English Translation).

International Search Report dated Mar. 6, 2020 in corresponding International application No. PCT/CN2019/089832; 4 pages.

Office Action dated May 24, 2022 in corresponding Chinese Application No. 201980004135.6; 20 pages including English-language translation.

Notification to Grant Patent dated Nov. 4, 2022, in corresponding Chinese Application No. 201980004135.6, 6 pages.

* cited by examiner

PACKAGE STRUCTURE AND PACKAGING METHOD

CROSS-REFERENCE TO RELATED APPLICATION

This application is a continuation of International Application No. PCT/CN2019/089832, filed on Jun. 3, 2019, the content of which is incorporated herein by reference in its entirety.

TECHNICAL FIELD

The present disclosure relates to the technical field of chip package, and in particular, to a package structure and a packaging method.

BACKGROUND

With the development of science and technology, a requirement for a communication speed of a chip is getting higher and higher. Therefore, a higher requirement is put forward for a chip package structure.

At present, in order to ensure the stability of performance and service life of a chip, every external channel of the chip must be provided with an electro-static discharge (ESD for short) protection circuit, so as to prevent static electricity from bringing instantaneous super charge inside the chip and causing static electricity damage to the chip.

However, the ESD protection circuit may bring relatively great parasitism to the channel where the ESD protection circuit is located, and the parasitism of the ESD protection circuit during chip operation will seriously affect the communication speed of the chip.

SUMMARY

The present disclosure provides a package structure and a packaging method, so as to realize electrostatic protection for a channel that needs to be protected in an electronic device during a packaging process of an electronic device, and reduce the parasitic influence of an ESD protection circuit on the electronic device after the packaging is finished.

In a first aspect, the present disclosure provides a package structure, including: a package base and a redistribution layer disposed on the package base;

where the package base includes a plurality of device areas; and a channel set is provided in a device area, the channel set is used to connect an electronic device, and the redistribution layer is used to lead a subset of to-be-protected channels that needs electrostatic protection in the channel set out to a preset area on the package base, so that all or part of channels in the subset of to-be-protected channels form a series circuit in the preset area, where the series circuit is used to connect with an electrostatic discharge end.

In a possible design, the package base further includes: a device separation area set between adjacent device areas;

where the preset area is the device separation area, and the series circuit is disconnected during a separation operation on the device separation area; or, the preset area is a partial area in the device area; and the series circuit is disconnected after a packaging operation of the electronic device is completed.

In a possible design, an insulating layer is provided on the package base; where the insulating layer is provided with a window structure; the redistribution layer is disposed on a side of the insulating layer away from the package base; and the redistribution layer is connected with a channel in the channel set through the window structure.

In a possible design, a channel lead pad is provided on the package base, where the channel lead pad is used to establish a connection between the channel and the electronic device; and the channel lead pad is connected with the redistribution layer through the window structure.

In a possible design, the package base is provided with a channel window, and the channel lead pad is disposed on the channel window, so as to establish a connection between the channel lead pad and the channel.

In a possible design, the electrostatic discharge end is a grounding end or an electrostatic protection module port.

In a possible design, the redistribution layer is made of a metal material or a non-metal conductive material.

In a possible design, the redistribution layer is a single-layer structure or a multi-layer structure.

In a possible design, the package base is a wafer, a substrate or a flexible circuit board.

In a possible design, a protective coating is provided on the redistribution layer.

In a second aspect, the present disclosure further provides a packaging method, including:

providing a redistribution layer and a channel set on a device area of a package base, where a subset of to-be-protected channels that needs electrostatic protection in the channel set is led out to a preset area on the package base through the redistribution layer, so that all or part of channels in the subset of to-be-protected channels form a series circuit in the preset area, where the series circuit is used to connect with an electrostatic discharge end; and packaging an electronic device on the device area, so as to establish a connection between the channel set and the electronic device.

In a possible design, after packaging an electronic device on the device area, the packaging method further includes:

performing a separation operation on a device separation area, so as to disconnect the series circuit, where the device separation area is set between adjacent device areas, and the preset area is the device separation area; or, disconnecting the series circuit by a disconnection process on the redistribution layer, where the preset area is a partial area in the device area.

In a possible design, the providing a redistribution layer on a device area of a package base includes:

forming an insulating layer on the package base;

providing a window structure on the insulating layer; and forming the redistribution layer on a side of the insulating layer away from the package base; where the redistribution layer is connected with a channel in the channel set through the window structure.

In a possible design, the forming the redistribution layer on a side of the insulating layer away from the package base includes:

forming a conductive medium layer on a side of the insulating layer away from the package base; and patterning the conductive medium layer to form the redistribution layer.

In a possible design, after forming the redistribution layer, the packaging method further includes:

forming a protective coating on the redistribution layer.

In a possible design, the electrostatic discharge end is a grounding end or an electrostatic protection module port.

In a possible design, the redistribution layer is made of a metal material or a non-metal conductive material.

In a possible design, the redistribution layer is a single-layer structure or a multi-layer structure.

In a possible design, the package base is a wafer, a substrate or a flexible circuit board.

In the package structure and the packaging method provided by the present disclosure, a subset of to-be-protected channels that needs electrostatic protection in a channel set is led out to a preset area on a package base through a redistribution layer, so that all or part of channels in the subset of to-be-protected channels form a series circuit in the preset area and then connect with an electrostatic discharge end, thereby realizing electrostatic protection of the channel that needs to be protected.

BRIEF DESCRIPTION OF DRAWINGS

In order to more clearly explain the technical solutions of embodiments of the present disclosure or the prior art, the following will make a brief introduction to the drawings used in the description of the embodiments or the prior art. Obviously, the drawings in the following description are some of the embodiments of the present disclosure. Those skilled in the art can also obtain other drawings according to these drawings without creative efforts.

Through the above drawings, specific embodiments of the present disclosure have been shown, which will be described in more detail in the following. These drawings and descriptions are not intended to limit the scope of the conception of the present disclosure in any way, but to illustrate the concepts of the present disclosure for those skilled in the art with reference to specific embodiments.

DESCRIPTION OF EMBODIMENTS

In order to make purposes, technical solutions and advantages of embodiments of the present disclosure clearer, the technical solutions in the embodiments of the present disclosure will be described clearly and completely in combination with the drawings in the embodiments of the present disclosure. Obviously, the described embodiments are a part of, not all of, the embodiments of the present disclosure. On the basis of the embodiments of the present disclosure, all of other embodiments obtained by those skilled in the art without creative efforts fall into the protection scope of the present disclosure.

The terms "first", "second", "third", "fourth" and the like (if any) in the description and the claims as well as the drawings of the present disclosure are used to distinguish similar objects, rather than to describe a specific order or sequence. It should be understood that the data as used can be interchanged where appropriate so that the embodiments of the present disclosure described herein can, for example, be implemented in a sequence other than those illustrated or described here. In addition, the terms "include" and "comprise" as well as any variation thereof are intended to refer to non-exclusive inclusion. For example, a process, a method, a system, a product or an apparatus including a series of steps or units is not necessarily limited to those steps or units clearly listed, but may include other steps or units that are not clearly listed or inherent to such process, method, product or apparatus.

In combination with specific embodiments, the following describes in detail the technical solution of the present disclosure and how the technical solution of the present disclosure solves the above-mentioned technical problems. The following several specific embodiments can be combined with each other, and the same or similar concepts or processes may not be repeated in some embodiments. The embodiments of the present disclosure will be described in combination with the drawings.

Figure 1:
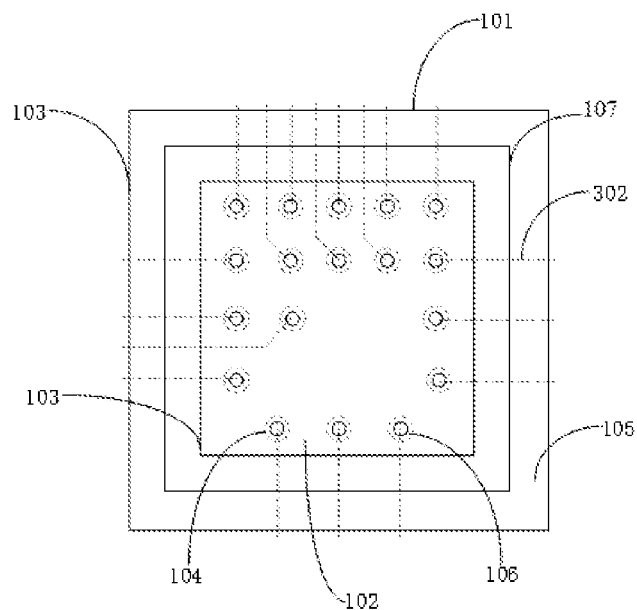
FIG. 1 is a schematic structural diagram of a package structure according to Embodiment 1 of the present disclosure.

FIG. 1 is a schematic structural diagram of a package structure according to Embodiment 1 of the present disclosure. As shown in FIG. 1, the package structure provided in this embodiment includes: a package base and a redistribution layer 302 disposed on the package base.

Where the package base includes a plurality of device areas 102. It is worth understanding that the package base may be a wafer, a substrate or a flexible circuit board, and there is no limitation on a specific form of the package base in this embodiment. In order to explain the principle of this embodiment in detail, a wafer 101 may be selected as the package base for illustration. As for the device area 102, it may be a partial area on the package base, which is used to package a chip or any other device.

Moreover, a channel set is provided in the device area 102, where the channel set in the device area 102 is used to connect an electronic device. It is worth understanding that a channel in the channel set here may be any connection channel in the package structure, which may be on the wafer 101, may be made by package processing, or may be on a substrate.

As for the redistribution layer 302, it may be understood as a patterned conductive layer on a surface of the wafer 101, and can be used to rearrange the channel set on the device area 102. The redistribution layer 302 may be a single-layer conductive layer structure or a multi-layer conductive layer structure. In this embodiment, there is no limitation on a specific layer number of the redistribution layer 302, and it is only necessary to ensure that a subset of to-be-protected channels 108 that needs electrostatic protection in the channel set on the device area 102 can be led out to a preset area on the wafer 101 through the redistribution layer 302, so that all or part of channels in the subset of to-be-protected channels 108 form a series circuit 107 in the preset area.

In addition, it should be understood that the above channel set may be a channel lead pad on the wafer 101, or may be a pad structure obtained by secondary packaging processing on the basis of the channel lead pad on the original wafer 101, and additionally, it may also be a channel lead pad on another type of substrate or flexible circuit board.

It is worth noting that in a packaging process of an electronic device, for example, in a packaging process of a chip, external environment (such as equipment, materials, persons, etc.) may bring static electricity, which can easily cause instantaneous super charge inside the chip. Therefore, it is necessary to perform electrostatic discharge protection on a channel which is in the device area 102 and is for establishing a connection with the chip. In the prior art, an individual ESD protection circuit is provided for each channel that needs to be protected, and after the package is finished and a chip module is formed through cutting, these ESD protection circuits are still parasitic on the channels. These parasitic ESD protection circuits consume power during the working of the chip module, and will cause reverse inductance when the chip module is working, thus reducing a driving voltage of each channel, thereby affecting the communication speed of the chip module.

In this embodiment, in order to be able to perform electrostatic protection on the channel that needs to be protected, all or part of channels in the subset of to-be-protected channels 108 that needs electrostatic protection in the channel set may form a series circuit 107 in a preset area of the wafer 101 through the redistribution layer 302, and the series circuit 107 may be connected with an electrostatic discharge end (such as an ESD protection module port or a ground wire).

Where, the preset area may be any position on the wafer 101, which may be determined according to an actual packaging process and a layout form of the channel set. Specifically, the preset area may be an area outside the device area 102 or a partial area in the device area, and it is only necessary to ensure that after the package of the electronic device is finished, medium layer disconnection processing of the series circuit 107 in the preset area will not affect the normal operation of the electronic device.

For example, the preset area may be a device separation area 105 set between adjacent device areas 102. All or part of channels in the subset of to-be-protected channels 108 that needs electrostatic protection in the channel set are led out to the device separation area 105 through the redistribution layer 302, and then all of the channels are connected in series or partially in series in the device separation area 105 to form a common potential. Then the series circuit 107 is connected with an ESD protection module port or a ground wire to form a zero potential. In this way, when the chip is affected by electrostatic discharge, the electric charge will preferentially move to a lower potential, and all of the electric charges will be led away along the channel provided with the ESD protection circuit or the ground wire, thereby protecting a circuit inside the chip from the effect of the electrostatic discharge. Where, the redistribution layer 302 may be made of a metal material, such as aluminum, copper, nickel, palladium, gold, etc., and any conductive material such as a non-metal conductive material may also be used.

The device separation area 105 may be an area formed by electronic device edges 103 of two adjacent device areas 102, where the device separation area 105 may be a cutting channel between chips. After the package of the chip is finished, the chips are separated by a chip separation process.

It can be seen that the package structure according to this embodiment can reduce the effect of ESD on the chip during the packaging process. Moreover, when the packaging is finished, the chips will be cut into individual chip, and the series circuit formed in the cutting channel will be cut off by a cutting process, so that the channels separate again to restore the chip function. When the chip is subsequently loaded onto a board, the ESD protection for the chip will be continued by the board-level ESD protection process.

For another example, the above preset area may also be a partial area in the device area 102. Specifically, the preset area may be a middle part of the device area 102 or other areas where the redistribution layer 302 can be laid out. The preset area can be adaptively designed according to a specific arrangement of the channel set in the device area 102. Specifically, all or part of channels in the subset of to-be-protected channels 108 that needs electrostatic protection in the channel set may be led out to a partial area in the device area 102 through the redistribution layer 302, and then all of the channels 108 are connected in series or partially in series in the partial area of the device area 102 to form a common potential. Then the series circuit 107 is connected with an ESD protection module port or a ground wire to form a zero potential. In this way, when the chip is affected by electrostatic discharge, the electric charge will preferentially move to a lower potential, and all of the electric charges will be led away along the channel provided with the ESD protection circuit or the ground wire, thereby protecting the circuit inside the chip from the effect of the electrostatic discharge.

After the packaging operation of the electronic device is finished, the series circuit 107 may be disconnected by a conductive medium layer cutting process, such as laser cutting. Then, the device areas 102 are sliced, and the chip are separated by a chip separation process.

It can be seen that the package structure according to this embodiment can reduce the effect of the ESD on the chip during the packaging process. Moreover, when the packaging is finished, the series circuit is disconnected by the conductive medium layer cutting process, so that the channels separate again to restore the chip function. When the chip is subsequently loaded onto a board, the ESD protection for the chip will be continued by the board-level ESD protection process.

In the present embodiment, a subset of to-be-protected channels that needs electrostatic protection in a channel set is led out to a preset area on a package base through a redistribution layer, so that all or part of channels in the subset of to-be-protected channels form a series circuit in the preset area and then connect with the electrostatic discharge end, thereby realizing electrostatic protection of the channel that needs to be protected.

In addition, after the package of the electronic device is finished, the channels may be separated again by disconnecting a multi-channel series circuit, so as to restore the chip function. It can be seen that a chip module obtained by slicing the package structure according to the embodiment can reduce or even avoid the parasitism of an ESD protection circuit on each channel of the chip, so as to effectively reduce power consumption during the working of the chip, and also improve the communication speed of the chip.

In order to describe in detail the package structure according to the present disclosure, a wafer may be selected as the package base, and a packaging method for the package structure may be combined for description.

Figure 2:
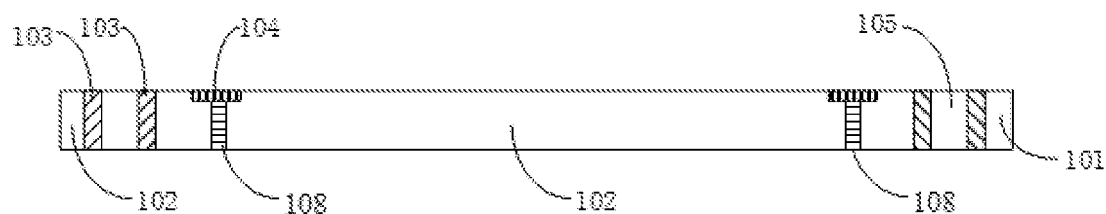
FIG. 2 is a schematic structural diagram of a package base of a package structure according to Embodiment 2 of the present disclosure.

FIG. 2 is a schematic structural diagram of a package base of a package structure according to Embodiment 2 of the present disclosure. As shown in FIG. 2, the wafer 101 includes a plurality of device areas 102 and a device separation area 105 set between adjacent device areas 102.

Moreover, a channel set is provided in the device area 102, where the channel set in the device area 102 is used to connect an electronic device. It is worth understanding that a channel in the channel set here may be any connection channel in the package structure, for example, may be a channel used to package a chip to establish a connection with the chip.

The wafer 101 is provided with a channel lead pad 104, where the channel lead pad 104 is used to establish a connection between the channel 108 and the electronic device.

The device separation area 105 may be an area formed by electronic device edges 103 of two adjacent device areas 102, where the device separation area 105 may be a cutting channel between chips. After the package of the chip is finished, the cutting channel is cut by a chip separation process to separate the chips.

It is worth noting that, referring to FIG. 1 and FIG. 2, it is necessary to confirm whether a pad window has been made for the channel lead pad 104 before processing a wafer 101. If a windowing process of an incoming material has been completed, the wafer 101 only needs a simple cleaning process and then can be used. If the windowing process of the incoming material has not been completed, a packaging factory needs to carry out the windowing process by a dry etching process or a wet etching process, so as to expose a metal pad.

Figure 3:
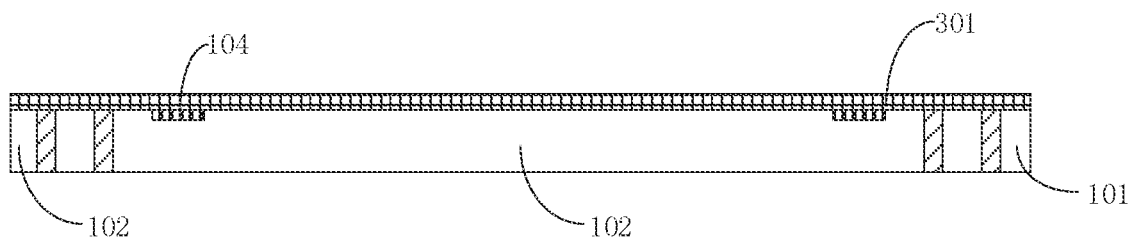
FIG. 3 is a schematic structural diagram of a conductive medium layer formed in the package structure according to Embodiment 2 of the present disclosure.

FIG. 3 is a schematic structure diagram of a conductive medium layer formed in the package structure according to Embodiment 2 of the present disclosure. As shown in FIG. 3, if an insulating layer on a surface of the wafer 101 can meet a preset insulation standard and parasitism standard when the wafer 101 leaves a factory, a conductive medium layer 301 can be directly formed on the wafer 101.

It is worth noting that the conductive medium layer 301 may be formed by sputtering, vapor deposition, electroplating, chemical plating, pasting conductive film and other processes. In this embodiment, there is no limitation on a specific forming process and material for the conductive medium layer 301, as long as theoretical conductive requirements can be met. Optionally, the conductive medium layer 301 is usually in micron scale, such as 1-8 microns.

Figure 4:
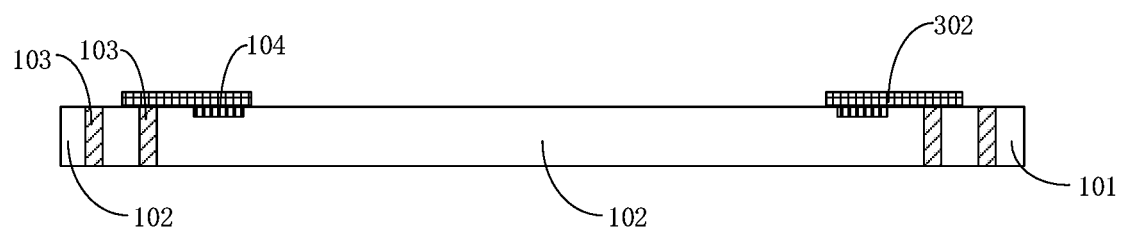
FIG. 4 is a schematic structural diagram of a redistribution layer formed in the package structure according to Embodiment 2 of the present disclosure.

FIG. 4 is a schematic structure diagram of a redistribution layer formed in the package structure according to Embodiment 2 of the present disclosure. As shown in FIG. 4, after the conductive medium layer is formed, the conductive medium layer 301 needs to be patterned to form the redistribution layer 302. It is worth noting that the conductive medium layer 301 may be patterned by means of first photoresist coating, then photoetching, and then dry etching, or by means of first photoresist coating, then photoetching, and then wet etching, or by means of other patterning processes such as laser direct writing. In this embodiment, there is no limitation on a specific patterning process for the conductive medium layer 301.

Referring to FIG. 1 again, the redistribution layer 302 formed by a patterning process can lead all or part of channels in the channel set to the device separation area 105 to form a series circuit 107, and the series circuit 107 is then connected with an electrostatic discharge end (for example, a channel provided with an ESD protection circuit or a ground wire). Therefore, all of the channels 108 that need ESD protection are led to the device separation area 105, and then all of the channels 108 are connected in series or partially in series in the device separation area 105 to form a common potential. Then the series circuit 107 is connected with the channel with ESD protection or the ground wire to form a zero potential. In this way, when the chip is affected by electrostatic discharge, the electric charge will preferentially move to a lower potential, and all of the electric charges will be led away along the channel provided with the ESD protection circuit or the ground wire, thereby protecting the circuit inside the chip from the effect of the electrostatic discharge.

Figure 5:
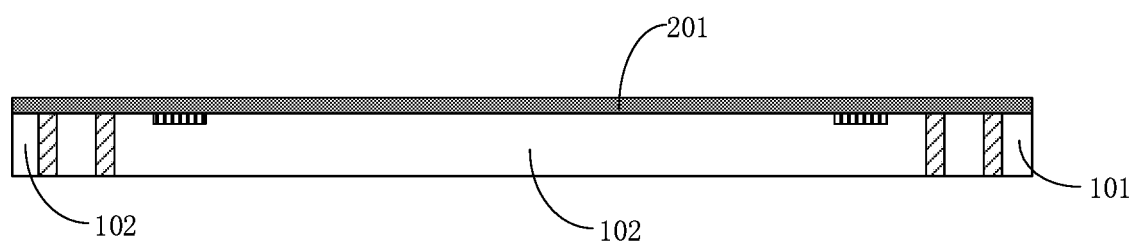
FIG. 5 is a schematic structural diagram of an insulating layer formed in a package structure according to Embodiment 3 of the present disclosure.

FIG. 5 is a schematic structure diagram of an insulating layer formed in the package structure according to Embodiment 3 of the present disclosure. Referring to FIG. 2 and FIG. 5, if an insulating layer on a surface of a wafer 101 cannot meet a preset insulation standard and parasitism standard when the wafer 101 leaves the factory, it is necessary to provide an insulating layer 201 on the wafer 101.

Specifically, the insulating layer 201 may be formed on the wafer 101, where a layer of insulating layer 201 may be formed on the surface of the wafer 101 by means of uniform coating, plasma spraying, printing, film pasting and the like.

Figure 6:
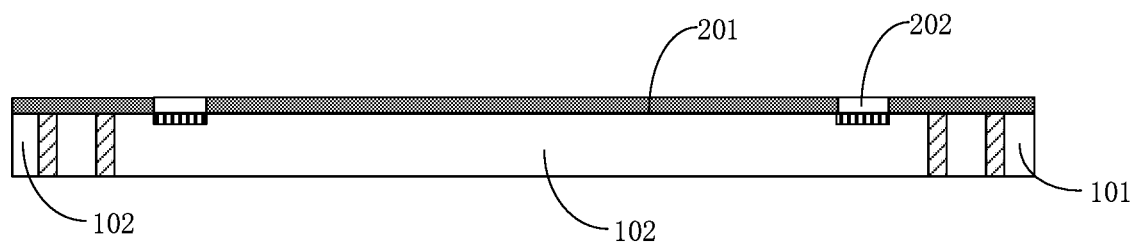
FIG. 6 is a schematic structural diagram of a window structure formed in the package structure according to Embodiment 3 of the present disclosure.

FIG. 6 is a schematic structure diagram of a window structure formed in the package structure according to Embodiment 3 of the present disclosure. As shown in FIG. 6, in order to form an effective connection, after the insulating layer 201 is formed, it is necessary to provide a window structure 202 on the insulating layer.

Specifically, as for the forming process of the window structure 202, a photoetching process and an etching process may be used to form the window structure 202 on the insulating layer 201, so as to expose the channel lead pad 104.

In addition, it is worth noting that there is no specific limitation on the forming process of the insulating layer 201 and the window structure 202, and there is also no specific limitation on the material of the insulating layer 201, as long as it is ensured that the surface of the device area 102 can be insulated, and the channel lead pad 104 can be exposed. Optionally, the thickness of the insulating layer 201 is usually in micron scale, for example, 5 microns.

Figure 7:
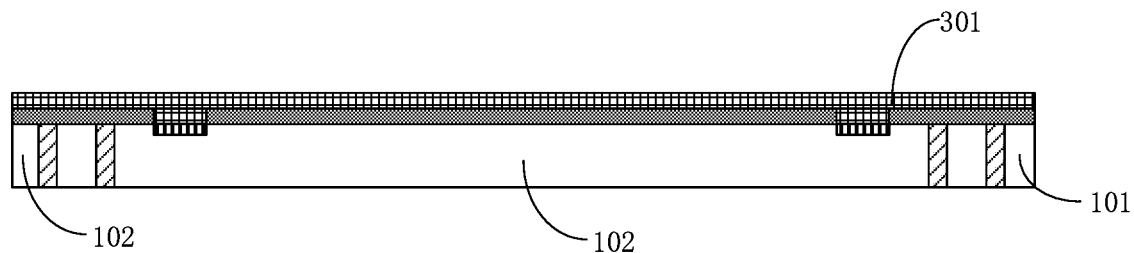
FIG. 7 is a schematic structural diagram of a conductive medium layer formed in the package structure according to Embodiment 3 of the present disclosure.

FIG. 7 is a schematic structure diagram of a conductive medium layer formed in the package structure according to Embodiment 3 of the present disclosure. As shown in FIG. 7, after the insulating layer 201 is formed on the wafer 101 and the window structure 202 is formed, a conductive medium layer 301 may be further formed on a side of the insulating layer 201 away from the wafer 101.

It is worth noting that the conductive medium layer 301 may be formed by sputtering, vapor deposition, electroplating, chemical plating, pasting conductive film and other processes. In this embodiment, there is no limitation on a specific forming process and material for the conductive medium layer 301, as long as theoretical conductive requirements can be met. Optionally, the conductive medium layer 301 is usually in micron scale, such as 1-8 microns.

Figure 8:
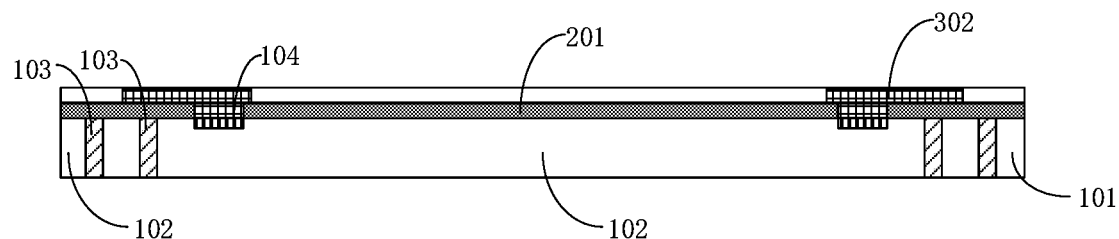
FIG. 8 is a schematic structural diagram of a redistribution layer formed in the package structure according to Embodiment 3 of the present disclosure.

FIG. 8 is a schematic structure diagram of a redistribution layer formed in the package structure according to Embodiment 3 of the present disclosure. As shown in FIG. 8, after the conductive medium layer is formed, the conductive medium layer 301 needs to be patterned to form the redistribution layer 302. It is worth noting that the conductive medium layer 301 may be patterned by means of first photoresist coating, then photoetching, and then dry etching, or by means of first photoresist coating, then photoetching, and then wet etching, or by means of other patterning processes such as laser direct writing. In this embodiment, there is no limitation on a specific patterning process for the conductive medium layer 301.

Referring to FIG. 1 again, the redistribution layer 302 formed by a patterning process can lead all or part of channels in the channel set to the device separation area 105 to form a series circuit 107, and the series circuit 107 is then connected with an electrostatic discharge end (for example, a channel provided with an ESD protection circuit or a ground wire). Therefore, all of the channels 108 that need ESD protection are led to the device separation area 105, and then all of the channels 108 are connected in series or partially in series in the device separation area 105 to form a common potential. Then the series circuit 107 is connected with the channel with ESD protection or the ground wire to form a zero potential. In this way, when the chip is affected by electrostatic discharge, the electric charge will preferentially move to a lower potential, and all of the electric charges will be led away along the channel provided with the ESD protection circuit or the ground wire, thereby protecting the circuit inside the chip from the effect of the electrostatic discharge.

On the basis of the above embodiments, in order to protect the formed redistribution layer 302, a protective coating may be further provided on the redistribution layer 302, and then whether to make a window for the protective coating and a subsequent process can be set according to actual packaging requirements.

Figure 9:
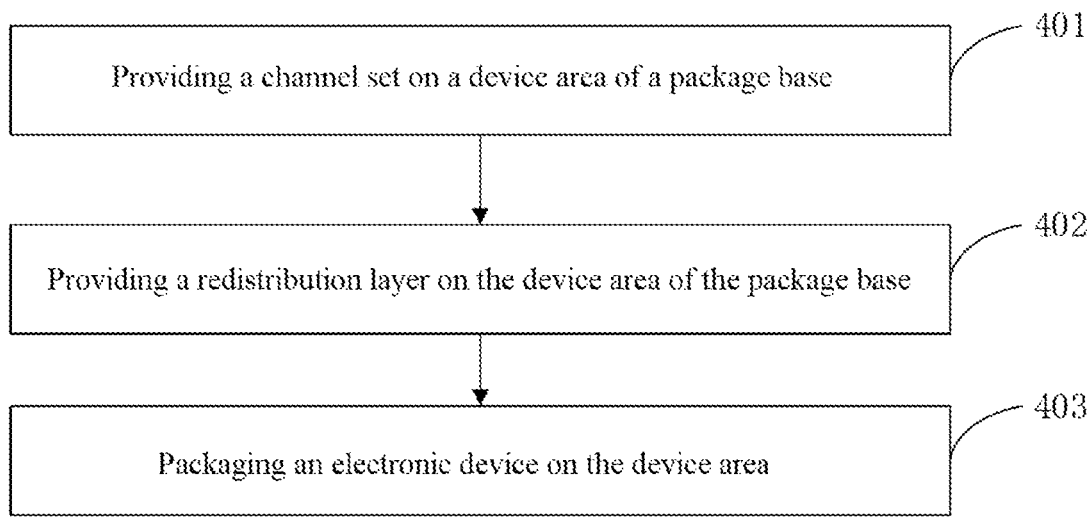
FIG. 9 is a schematic flowchart of a packaging method according to Embodiment 4 of the present disclosure.

FIG. 9 is a schematic flowchart of a packaging method according to Embodiment 4 of the present disclosure. As shown in FIG. 9, the packaging method according to this embodiment includes:

Step 401: providing a channel set on a device area of a package base.

The package base includes a plurality of device areas. It is worth understanding that the package base may be a wafer, a substrate or a flexible circuit board, and there is no limitation on a specific form of the package base in this embodiment. In order to explain principle of this embodiment in detail, a wafer may be selected as the package base for illustration. As for the device area, it may be a partial area on the package base, which is used to package a chip or any other device.

Specifically, a channel set is provided in the device area, where the channel set in the device area is used to connect an electronic device. It is worth understanding that a channel in the channel set here may be any connection channel in the package structure, which may be on the wafer, may be made by package processing, or may be on the substrate.

Optionally, the above channel set may be a channel lead pad on the wafer, or may be a pad structure obtained by secondary packaging processing on the basis of the channel lead pad on the original wafer, and additionally, it may also be a channel lead pad on another type of substrate or flexible circuit board.

Step 402: providing a redistribution layer on the device area of the package base.

Specifically, as for the redistribution layer, it may be understood as a patterned conductive layer on a surface of the wafer, and can be used to rearrange the channel set on the device area. The redistribution layer may be a single-layer conductive layer structure or a multi-layer conductive layer structure. In this embodiment, there is no limitation on a specific layer number of the redistribution layer, and it is only necessary to ensure that a subset of to-be-protected channels that needs electrostatic protection in the channel set on the device area can be led out to a preset area on the wafer through the redistribution layer, so that all or part of channels in the subset of to-be-protected channels form a series circuit in the preset area.

Step 403: packaging an electronic device on the device area.

After the redistribution layer is provided on the device area of the package base, an electronic device can be packaged on the device area.

In a packaging process of the electronic device, for example, in a packaging process of a chip, external environment (such as equipment, materials, persons, etc.) may bring static electricity, which can easily cause instantaneous super charge inside the chip. Therefore, it is necessary to perform electrostatic discharge protection on a channel which is in the device area 102 and is for establishing a connection with the chip. In the prior art, an individual ESD protection circuit is provided for each channel that needs to be protected, and after the package is finished and a chip module is formed through cutting, these ESD protection circuits are still parasitic on the channels. These parasitic ESD protection circuits consume power during the working of the chip module, and will cause reverse inductance when the chip module is working, thus reducing a driving voltage of each channel, thereby affecting the communication speed of the chip module.

In this embodiment, in order to be able to perform electrostatic protection on the channel that needs to be protected, all or part of channels in the subset of to-be-protected channels that needs electrostatic protection in the channel set may form a series circuit in a preset area of the wafer through the redistribution layer, and the series circuit may be connected with an electrostatic discharge end (such as an ESD protection module port or a ground wire).

Figure 10:
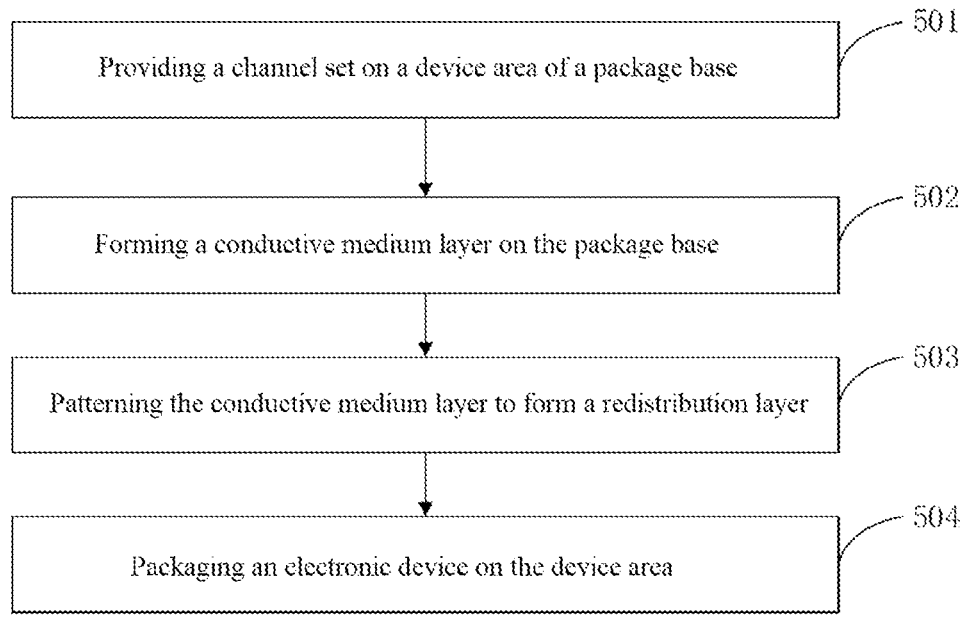
FIG. 10 is a schematic flowchart of a packaging method according to Embodiment 5 of the present disclosure.

FIG. 10 is a schematic flowchart diagram of a packaging method according to Embodiment 5 of the present disclosure. As shown in FIG. 10, the packaging method according to this embodiment includes:

Step 501: providing a channel set on a device area of a package base.

It is worth noting that the specific description of the step 501 in this embodiment refers to the description related to the step 401 in FIG. 9, which will not be repeated here.

Step 502: forming a conductive medium layer on the package base.

The package base includes a plurality of device areas and a device separation area set between adjacent device areas. It is worth understanding that the package base may be a wafer, a substrate or a flexible circuit board, and there is no limitation on a specific form of the package base in this embodiment. In order to explain principles in the embodiment in detail, a wafer may be selected as the package base for illustration.

Specifically, the wafer includes a plurality of device areas and a device separation area set between adjacent device areas.

Moreover, a channel set is provided in the device area, where the channel set in the device area is used to connect an electronic device. It is worth understanding that a channel in the channel set here may be any connection channel in the package structure, for example, may be a channel used to package a chip to establish a connection with the chip.

The wafer is provided with a channel lead pad, where the channel lead pad is used to establish a connection between the channel and the electronic device.

The device separation area may be an area formed by electronic device edges of two adjacent device areas, where the device separation area may be a cutting channel between chips. After the package of the chip is finished, the cutting channel is cut by a chip separation process to separate the chips.

If an insulating layer on a surface of the wafer can meet a preset insulation standard and parasitism standard when the wafer leaves a factory, a conductive medium layer can be directly formed on the wafer.

It is worth noting that the conductive medium layer may be formed by sputtering, vapor deposition, electroplating, chemical plating, pasting conductive film and other processes. In this embodiment, there is no limitation on a specific forming process and material for the conductive medium layer, as long as theoretical conductive requirements can be met. Optionally, the conductive medium layer is usually in micron scale, such as 1-8 microns.

Step 503: patterning the conductive medium layer to form a redistribution layer.

After the conductive medium layer is formed, the conductive medium layer needs to be patterned to form the redistribution layer. It is worth noting that the conductive medium layer may be patterned by means of first photoresist coating, then photoetching, and then dry etching, or by means of first photoresist coating, then photoetching, and then wet etching, or by means of other patterning processes such as laser direct writing. In this embodiment, there is no limitation on a specific patterning process for the conductive medium layer.

Step 504: packaging an electronic device on the device area.

The redistribution layer formed by a patterning process can lead all or part of channels in the subset of to-be-protected channels that needs electrostatic protection in the channel set out to the preset area of the package base to form a series circuit.

Where, the above preset area may be any position on the package base, which may be determined according to an actual packaging process and a layout form of the channel set. Specifically, the preset area may be an area outside the device area or a partial area in the device area, and it is only necessary to ensure that after the package of the electronic device is finished, medium layer disconnection processing of the series circuit in the preset area will not affect the normal operation of the electronic device.

For example, the preset area may be a device separation area set between adjacent device areas 102. All or part of channels in the subset of to-be-protected channels that needs electrostatic protection in the channel set are led out to the device separation area through the redistribution layer, and then all of the channels are connected in series or partially in series in the device separation area 105 to form a common potential. Then the series circuit is connected with an ESD protection module port or a ground wire to form a zero potential. In this way, when the chip is affected by electrostatic discharge, the electric charge will preferentially move to a lower potential, and all of the electric charges will be led away along the channel provided with the ESD protection circuit or the ground wire, thereby protecting a circuit inside the chip from the effect of the electrostatic discharge. Where, the redistribution layer 302 may be made of a metal material, such as aluminum, copper, nickel, palladium, gold, etc., and any conductive material such as a non-metal conductive material may also be used.

For another example, the above preset area may also be a partial area in the device area. Specifically, the preset area may be a middle part of the device area or other areas where the redistribution layer can be laid out. The preset area can be adaptively designed according to a specific arrangement of the channel set in the device area. All or part of channels in the subset of to-be-protected channels that needs electrostatic protection in the channel set may be led out to a partial area in the device area through the redistribution layer, and then all of the channels are connected in series or partially in series in the partial area of the device area to form a common potential. Then the series circuit is connected with an ESD protection module port or a ground wire to form a zero potential. In this way, when the chip is affected by electrostatic discharge, the electric charge will preferentially move to a lower potential, and all of the electric charges will be led away along the channel provided with the ESD protection circuit or the ground wire, thereby protecting the circuit inside the chip from the effect of the electrostatic discharge.

In this embodiment, by forming the redistribution layer, the subset of to-be-protected channels that needs electrostatic protection in the channel set can be led out to the preset area of the package base, so that all or part of channels in the subset of to-be-protected channels form a series circuit in the preset area and then connect with the electrostatic discharge end, thereby realizing electrostatic protection of the channel that needs to be protected.

On the basis of the above Embodiment 4, in order to slice the package structure obtained by the above embodiment to obtain a chip module, and ensure that the sliced chip module can work normally, after the package of the electronic device is finished, it is also necessary to disconnect the series circuit formed by all or part of channels in the subset of to-be-protected channels in the preset area.

Specifically, when the above preset area is a device separation area, the device separation area can be set as a cutting channel between chips. After the package of the chip is finished, the chips are separated by a chip separation process. When the packaging is finished, the chips will be cut into individual chips, and the series circuit formed in the cutting channel will be cut off by a cutting process, so that the channels separate again to restore the chip function. When the chip is subsequently loaded onto a board, the ESD protection for the chip will be continued by the board-level ESD protection process.

In addition, when the above preset area is a partial area in the device area, after the package of the electronic device is finished, the series circuit may be disconnected by a conductive medium layer cutting process, such as laser cutting. Then, the device areas are sliced, and the chips are separated by the chip separation process.

It can be seen that in this embodiment, the series circuit for electrostatic protection is disconnected to separate the channels again, so as to restore the chip function. It can be seen that the package structure according to this embodiment can reduce or even avoid the parasitism of the ESD protection circuit on each channel, so as to effectively reduce power consumption during the working of the chip, and also improve the communication speed of the chip.

Figure 11:
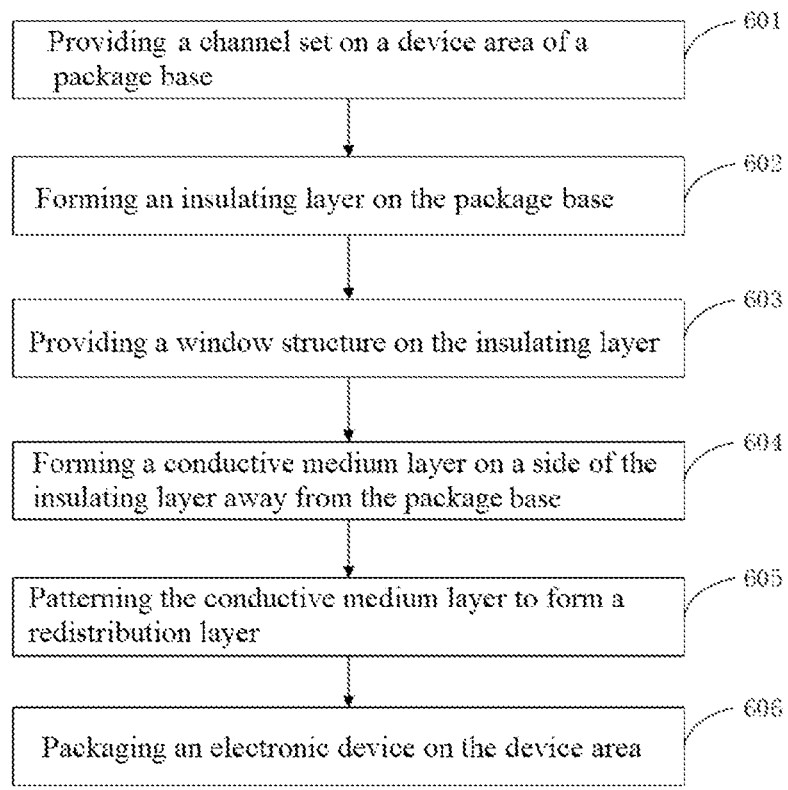
FIG. 11 is a schematic flowchart of a packaging method according to Embodiment 6 of the present disclosure.

FIG. 11 is a flow schematic chart of a packaging method according to Embodiment 6 of the present disclosure. As shown in FIG. 11, the packaging method according to this embodiment includes:

Step 601: providing a channel set on a device area of a package base.

It is worth noting that the specific description of the step 601 in this embodiment refers to the description related to the step 401 in FIG. 9, which will not be repeated here.

Step 602: forming an insulating layer on the package base.

A wafer may be also selected as the package base for illustration. Specifically, if an insulating layer on a surface of the wafer cannot meet the preset insulation standard and parasitism standard when the wafer leaves a factory, it is necessary to dispose an insulating layer on the wafer.

Specifically, the insulating layer may be formed on the wafer, where a layer of insulating layer may be formed on the surface of the wafer by means of uniform coating, plasma spraying, printing, film pasting and the like.

Step 603: providing a window structure on the insulating layer.

In order to form an effective connection, after the insulating layer is formed, it is necessary to provide a window structure on the insulating layer.

Specifically, as for the forming process of the window structure, the photoetching process and the etching process may be used to form the window structure on the insulating layer, so as to expose the channel lead pad.

In addition, it is worth noting that there is no specific limitation on the forming process of the insulating layer and the window structure, and there is also no specific limitation on the material of the insulating layer, as long as it is ensured that the surface of the device area can be insulated, and the channel lead pad can be exposed. Optionally, the thickness of the insulating layer is usually in micron scale, for example, 5 microns.

Step 604: forming a conductive medium layer on a side of the insulating layer away from the package base.

After the insulating layer is formed on the wafer and the window structure is formed, a conductive medium layer may be further formed on the side of the insulating layer away from the wafer.

It is worth noting that the conductive medium layer may be formed by sputtering, vapor deposition, electroplating, chemical plating, pasting conductive film and other processes. In this embodiment, there is no limitation on a specific forming process and material for the conductive medium layer, as long as theoretical conductive requirements can be met. Optionally, the conductive medium layer is usually in micron scale, such as 1-8 microns.

Step 605: patterning the conductive medium layer to form a redistribution layer.

After the conductive medium layer is formed, the conductive medium layer needs to be patterned to form the redistribution layer. It is worth noting that the conductive medium layer may be patterned by means of first photoresist coating, then photoetching, and then dry etching, or by means of first photoresist coating, then photoetching, and then wet etching, or by means of other patterning processes such as laser direct writing. In this embodiment, there is no limitation on a specific patterning process for the conductive medium layer.

Step 606: packaging an electronic device on the device area.

It is worth noting that the specific implementation of the step 606 in this embodiment refers to the description of the step 504 in the embodiment shown in FIG. 10, which will not be repeated here.

Those skilled in the art will easily think of other implementations of the present disclosure after considering the description and practicing the disclosure herein. The present disclosure is intended to cover any variations, uses or adaptive changes of the present disclosure, and these variations, uses or adaptive changes follow general principles of the present disclosure and include common knowledge or conventional technical means in the technical field that is not disclosed in the present disclosure. The description and the embodiments are only regarded as illustrative, and the true scope and spirit of the present disclosure are pointed out by the following claims.

It should be understood that the present disclosure is not limited to the precise structures already described above and shown in the drawings, and various modifications and changes may be made without departing from the scope thereof. The scope of the present disclosure is only limited by the claims.

What is claimed is:

1. A package structure, comprising: a package base and a redistribution layer disposed on the package base;
   the package base comprises a plurality of device areas; and
   a channel set is provided in a device area, the channel set is used to connect an electronic device, and a subset of to-be-protected channels that needs electrostatic protection in the channel set is led out to a preset area on the package base through the redistribution layer, so that all or part of channels in the subset of to-be-protected channels form a series circuit in the preset area through the redistribution layer, wherein the series circuit is used for all or part of channels in the subset of to-be-protected channels to form a common potential in the preset area and connect with an electrostatic discharge end.

2. The package structure according to claim 1, wherein the package base further comprises: a device separation area set between adjacent device areas;
   wherein the preset area is the device separation area; or, the preset area is a partial area in the device area.

3. The package structure according to claim 1, wherein an insulating layer is provided on the package base; wherein
   the insulating layer is provided with a window structure;
   the redistribution layer is disposed on a side of the insulating layer away from the package base; and
   the redistribution layer is connected with a channel in the channel set through the window structure.

4. The package structure according to claim 2, wherein an insulating layer is provided on the package base; wherein
   the insulating layer is provided with a window structure;
   the redistribution layer is disposed on a side of the insulating layer away from the package base; and
   the redistribution layer is connected with a channel in the channel set through the window structure.

5. The package structure according to claim 3, wherein the channel set is a channel lead pad on the package base and is used to connect with the electronic device; and
   the channel lead pad is connected with the redistribution layer through the window structure.

6. The package structure according to claim 1, wherein the electrostatic discharge end is a grounding end or an electrostatic protection module port.

7. The package structure according to claim 1, wherein the redistribution layer is made of a metal material or a non-metal conductive material.

8. The package structure according to claim 1, wherein the redistribution layer is a single-layer structure or a multi-layer structure.

9. The package structure according to claim 1, wherein the package base is a wafer, a substrate or a flexible circuit board.

10. The package structure according to claim 1, wherein a protective coating is provided on the redistribution layer.

\* \* \* \* \*